US010134976B2

United States Patent
Takabe et al.

(10) Patent No.: US 10,134,976 B2
(45) Date of Patent: *Nov. 20, 2018

(54) PIEZOELECTRIC ELEMENT, LIQUID DISCHARGING HEAD PROVIDED WITH PIEZOELECTRIC ELEMENT, AND LIQUID DISCHARGING APPARATUS

(71) Applicant: SEIKO EPSON CORPORATION, Tokyo (JP)

(72) Inventors: Motoki Takabe, Shiojiri (JP); Eiju Hirai, Azumino (JP); Toshihiro Shimizu, Fujimi-machi (JP); Naoto Yokoyama, Matsumoto (JP); Eiji Osawa, Suwa (JP)

(73) Assignee: Seiko Epson Corporation, Tokyo (JP)

( * ) Notice: Subject to any disclaimer, the term of this patent is extended or adjusted under 35 U.S.C. 154(b) by 0 days.

This patent is subject to a terminal disclaimer.

(21) Appl. No.: 15/583,248

(22) Filed: May 1, 2017

(65) Prior Publication Data

US 2017/0236995 A1  Aug. 17, 2017

Related U.S. Application Data

(63) Continuation of application No. 15/076,971, filed on Mar. 22, 2016, now Pat. No. 9,666,784.

(30) Foreign Application Priority Data

Apr. 6, 2015  (JP) .................................. 2015-077375

(51) Int. Cl.
  *H01L 41/187* (2006.01)
  *B41J 2/14* (2006.01)
  (Continued)

(52) U.S. Cl.
  CPC ...... *H01L 41/1876* (2013.01); *B41J 2/14233* (2013.01); *B41J 2/161* (2013.01);
  (Continued)

(58) Field of Classification Search
  CPC ................ B41J 2/14233; B41J 2/14258; B41J 2/14274; B41J 2/14314; B41J 2/14427;
  (Continued)

(56) References Cited

U.S. PATENT DOCUMENTS 7,475,967 B2   1/2009 Nakagawa
7,717,546 B2 * 5/2010 Noguchi .............. B41J 2/14233
                                                     347/71

(Continued)

FOREIGN PATENT DOCUMENTS

JP     2010241021 A    10/2010

OTHER PUBLICATIONS

Notice of Allowance issued in U.S. Appl. No. 15/076,971 dated Jan. 30, 2017.

(Continued)

*Primary Examiner* — Anh T. N. Vo
(74) *Attorney, Agent, or Firm* — Workman Nydegger

(57) ABSTRACT

The piezoelectric body is configured to have a layered structure such that a plurality of unit layers are stacked in a film thickness direction, and each of the unit layers is formed of a first layer on which the displacement is relatively easy to occur, and a second layer which has a high concentration of Zr as compared with the first layer. In addition, when composition ratio Ti/(Zr+Ti) of Zr to Ti in each of the first layer and the second layer is set as Cr1 and Cr2, the composition ratio of each layer is adjusted so as to satisfy the following conditions (1) to (3):

$0.41 \leq Cr1 \leq 0.81$  (1)

$0.1 \leq Cr1 - Cr2 \leq 0.3$  (2)

$Cr1 > Cr2$  (3).

10 Claims, 5 Drawing Sheets

(51) Int. Cl.
*H01L 41/047* (2006.01)
*H01L 41/083* (2006.01)
*H01L 41/27* (2013.01)
*B41J 2/16* (2006.01)
*H01L 41/277* (2013.01)
*H01L 41/08* (2006.01)
*H01L 41/09* (2006.01)

(52) U.S. Cl.
CPC ........... *B41J 2/1609* (2013.01); *B41J 2/1612* (2013.01); *B41J 2/1618* (2013.01); *B41J 2/1623* (2013.01); *B41J 2/1626* (2013.01); *H01L 41/0471* (2013.01); *H01L 41/083* (2013.01); *H01L 41/0805* (2013.01); *H01L 41/09* (2013.01); *H01L 41/0973* (2013.01); *H01L 41/27* (2013.01); *H01L 41/277* (2013.01); *B41J 2002/14241* (2013.01); *B41J 2002/14362* (2013.01); *B41J 2202/03* (2013.01)

(58) Field of Classification Search
CPC ........ B41J 2/1609; B41J 2/161; B41J 2/1612; B41J 2/1618; H01L 41/0471; H01L 41/083; H01L 41/0973; H01L 41/1876; H01L 41/27; H01L 41/277
See application file for complete search history.

(56) References Cited

U.S. PATENT DOCUMENTS

| | | | |
|---|---|---|---|
| 7,998,362 B2 * | 8/2011 | Ifuku | .................. B41J 2/14233 117/944 |
| 8,210,659 B2 | 7/2012 | Li | |
| 8,277,031 B2 | 10/2012 | Sumi et al. | |
| 8,317,304 B2 | 11/2012 | Sumi et al. | |
| 2010/0253750 A1 | 10/2010 | Sumi | |
| 2015/0214468 A1 * | 7/2015 | Matsuda | ............. H01L 41/0815 347/68 |

OTHER PUBLICATIONS

Office Action issued in U.S. Appl. No. 15/076,971 dated Sep. 28, 2016.

* cited by examiner

PIEZOELECTRIC ELEMENT, LIQUID DISCHARGING HEAD PROVIDED WITH PIEZOELECTRIC ELEMENT, AND LIQUID DISCHARGING APPARATUS

CROSS-REFERENCE TO RELATED APPLICATIONS

This application is a continuation of U.S. patent application Ser. No. 15/076,971 filed on Mar. 22, 2016, entitled "PIEZOELECTRIC ELEMENT, LIQUID DISCHARGING HEAD PROVIDED WITH PIEZOELECTRIC ELEMENT, AND LIQUID DISCHARGING APPARATUS," which issued as U.S. Pat. No. 9,666,784 on Mar. 22, 2016, which claims priority to Japanese Patent Application No. JP 2015-077375 filed on Apr. 6, 2015, both of which applications are hereby incorporated by reference in their entirety.

BACKGROUND

1. Technical Field

The present invention relates to a piezoelectric element which includes a piezoelectric body containing zirconium and titanium, a liquid discharging head which is provided with piezoelectric element, and a liquid discharging apparatus.

2. Related Art

For example, in an ink jet recording head (a liquid discharging head), a piezoelectric element is preferably used as a driving source for discharging ink or used as various sensors. The piezoelectric element is formed in such a way of interposing a piezoelectric body between a pair of electrodes. As such a piezoelectric body, lead zirconate titanate (PZT) which is formed of perovskite type crystal containing titanium (Ti), zirconium (Zr), and lead (Pb) is mainly used (for example, refer to JP-A-2010-241021). In addition, a portion which is interposed between a lower electrode layer and an upper electrode layer in the piezoelectric body layer is an active portion which is deformed due to the voltage application on both electrode layers.

The properties of the piezoelectric element change depending on a composition of PZT. For example, in the composition ratio of titanium to zirconium, as the ratio of Ti becomes larger, it is possible to increase the amount of the displacement at the time of driving. On the other hand, there is a problem in that as the ratio of Ti becomes larger, leakage current is likely to flow. In contrast, as the ratio of Zr becomes larger, it is possible to suppress the leakage current; however, there is a problem in that as the ratio of Zr becomes larger, the amount of displacement at the time of driving is decreased.

SUMMARY

An advantage of some aspects of the invention is to provide a piezoelectric element configured such that it is possible to prevent not only the amount of displacement from being decreased, but also leakage current from occurring at the time of driving, a liquid discharging head provided with the piezoelectric element, and a liquid discharging apparatus.

Aspect 1

According to an aspect of the invention, there is provided a piezoelectric element, in which a first electrode, a piezoelectric body, and a second electrode are sequentially stacked, in which the piezoelectric body is a composite oxide containing titanium (Ti) and zirconium (Zr), and is configured such that when an electric field is provided between the first electrode and the second electrode, displacement on displacement layers is relatively easy to occur, and a plurality of high-concentrated Zr layers which have a high concentration of Zr as compared with the displacement layers are stacked on each other in a film thickness direction, in which when composition ratio Ti/(Zr+Ti) of zirconium to titanium in each of the displacement layer and high-concentrated Zr layer is set as Cr1 and Cr2, the composition ratio Cr1 is within a range of 0.41 to 0.81, and a difference between the composition ratio Cr1 and the composition ratio Cr2 is within a range of 0.1 to 0.3, Cr1>Cr2 is established.

According to a configuration of Aspect 1, the piezoelectric body is configured such that displacement on displacement layers is relatively easy to occur, and high-concentrated Zr layers which have a high concentration of Zr as compared with the displacement layers are stacked on each other in a film thickness direction, that is, the plurality of high-concentrated Zr layers which have a relatively high concentration of Zr are formed in the piezoelectric body in the film thickness direction, and thus it is possible to prevent not only the amount of displacement of the piezoelectric element from being decreased, but also leakage current thereof from occurring, at the time of driving. In addition, the plurality of displacement layers and high-concentrated Zr layers are formed in such a way of being stacked, and thus, even in a case where one of the high-concentrated Zr layers is damaged, it is possible to suppress the leakage current in other high-concentrated Zr layers. Therefore, the reliability of the piezoelectric element is improved.

Aspect 2

In the above-described configuration, it is preferable that the composition ratio Cr1 is within a range of 0.51 to 0.71.

According to the configuration of Aspect 2, it is possible to further reduce the occurrence of the leakage current in the displacement layer, and to reliably prevent the amount of the displacement from becoming decreased at the time of driving. For this reason, with the effect of preventing the leakage current in the high-concentrated Zr layer, it is possible to further improve the reliability of the piezoelectric element without deteriorating the performance thereof.

Aspect 3

In addition, according to another aspect of the invention, there is provided a liquid discharging head which includes the piezoelectric element according to the above-described Aspect 1 or 2, in which a liquid in a liquid flow passage is discharged through a nozzle by driving the piezoelectric element.

Aspect 4

Furthermore, according to still another aspect of the invention, there is provided a liquid discharging apparatus including the liquid discharging head according to the above-described Aspect 3.

According to the invention, the piezoelectric element which is configured such that the decrease in the amount of displacement of the piezoelectric element and the leakage current are prevented at the time of driving is installed, and thereby the improvement of the reliability of the liquid discharging head and the liquid discharging apparatus can be expected.

BRIEF DESCRIPTION OF THE DRAWINGS

The invention will be described with reference to the accompanying drawings, wherein like numbers reference like elements.

DESCRIPTION OF EXEMPLARY EMBODIMENTS

Hereinafter, an embodiment of the invention will be described with reference to the drawings. Note that the embodiment described below is limited to various preferred specific examples of the invention; however, the scope of the invention is not limited to the embodiments unless otherwise particularly limited in the following description.

Figure 1:
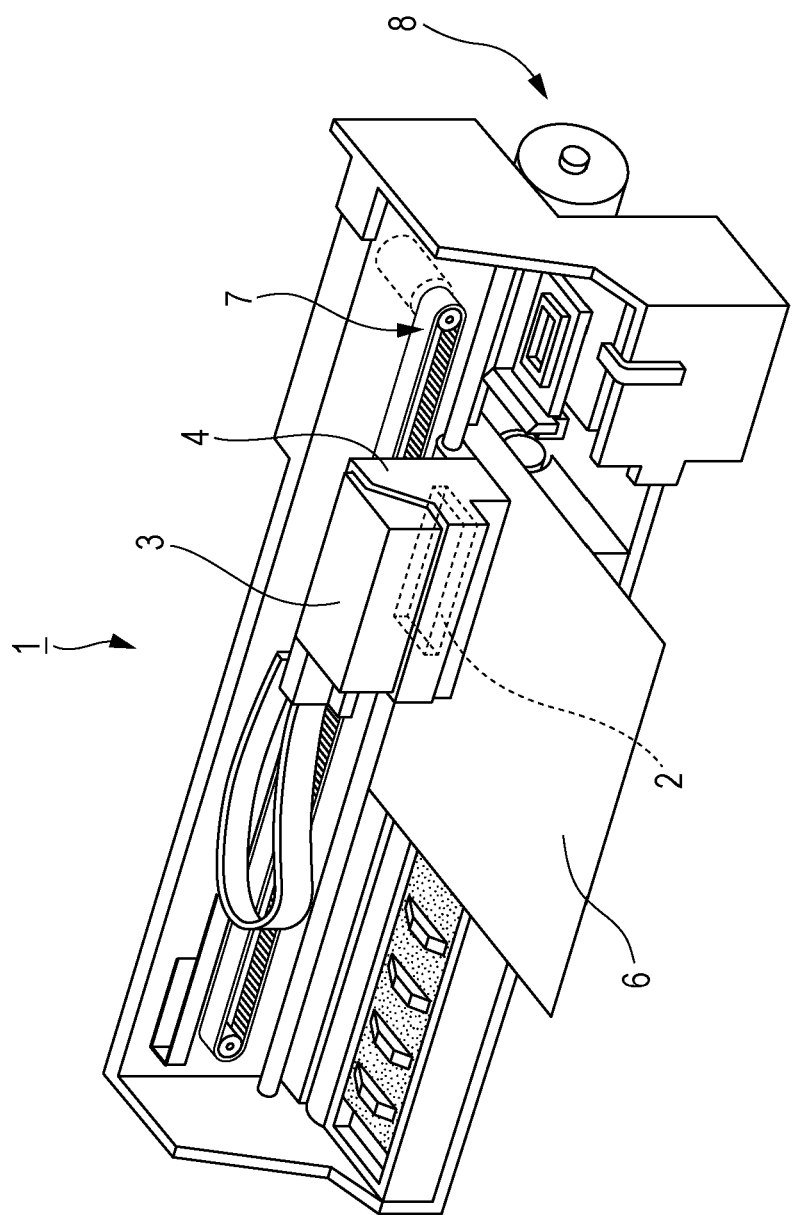
FIG. 1 is a perspective view illustrating an internal configuration of a printer.

FIG. 1 is a perspective view illustrating an internal configuration of a printer 1 (one type of liquid discharging apparatuses). The printer 1 is provided with a recording head 2 (one type of liquid discharging heads), a carriage 4 to which an ink cartridge 3 is detachably attached as a liquid supply source, a carriage moving mechanism 7 for moving the carriage 4 in a width direction of a recording sheet 6 (one type of recording media and landing target), that is, for reciprocating the carriage 4 in a scanning direction, and a sheet feeding mechanism 8 for transporting the recording sheet 6 in a sub scanning direction which is orthogonal to the main scanning direction. The carriage 4 is configured to move in the main scanning direction by the carriage moving mechanism 7. The printer 1 records text or images on the recording sheet 6 by reciprocating the carriage 4 while sequentially transporting the recording sheet 6. In addition, it is possible to employ a configuration such that the ink cartridge 3 is disposed on a main body of the printer 1 instead of the carriage 4, and the ink in the ink cartridge 3 is supplied to the recording head 2 through an ink supply tube.

Figure 2:
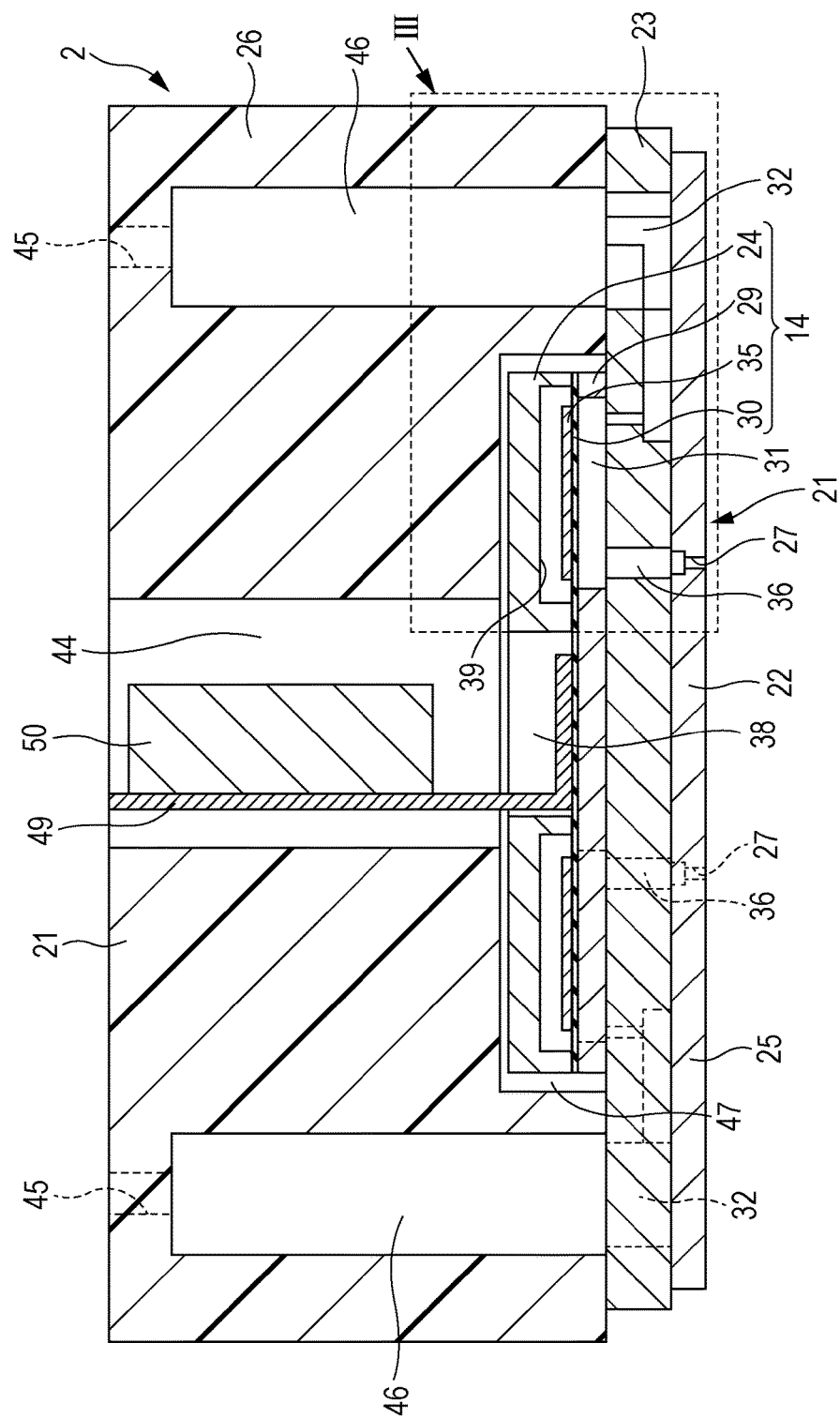
FIG. 2 is a sectional view illustrating a configuration a recording head.
Figure 3:
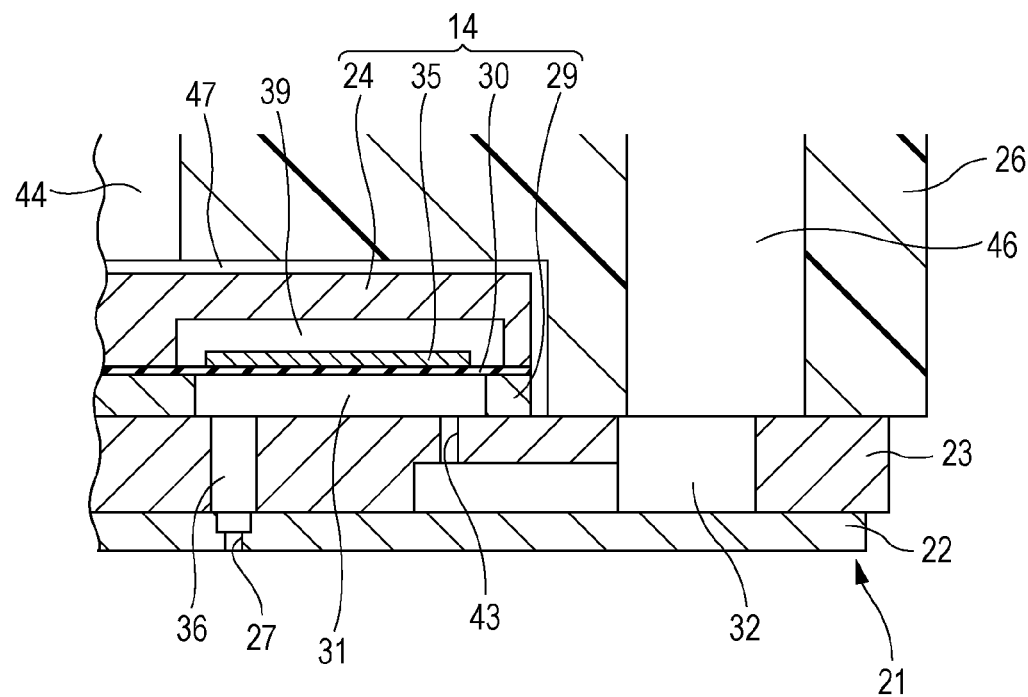
FIG. 3 is a sectional view of a main portion of the recording head.
Figure 4:
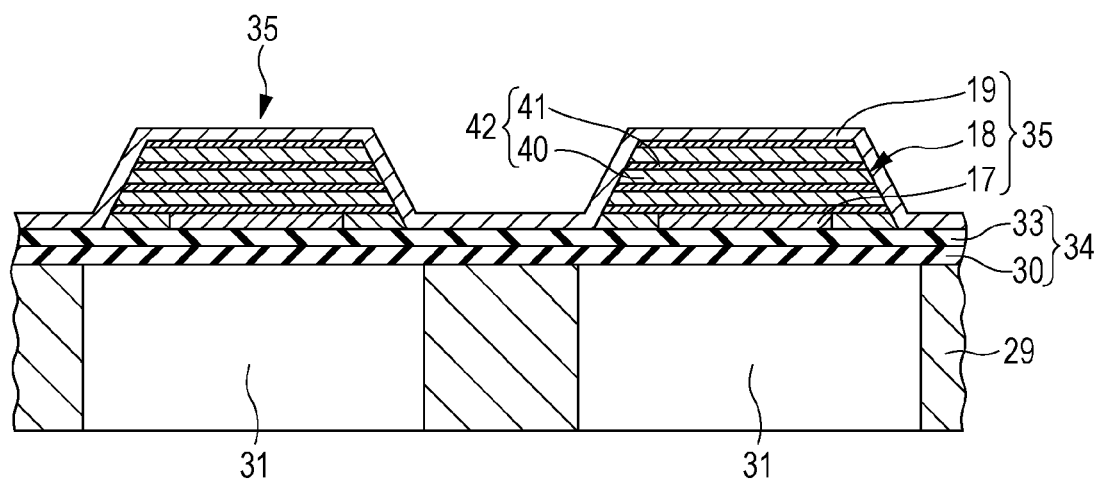
FIG. 4 is an expanded sectional view of the vicinity of a piezoelectric element.

FIG. 2 is a sectional view illustrating a configuration of a main portion of the recording head 2, and FIG. 3 is expanded view of area III in FIG. 2. In addition, FIG. 4 is a sectional view of a main portion of a piezoelectric element 35 and a pressure chamber substrate 29 in the width direction (a nozzle array direction) of a pressure chamber 31. The recording head 2 of the embodiment is provided with a pressure generation unit 14 and a flow passage unit 21, and the pressure generation unit 14 and the flow passage unit 21 are attached to a case 26 in a state of being stacked. The flow passage unit 21 includes a nozzle plate 22 and a communicating substrate 23. In addition, the pressure generation unit 14 is formed of a pressure chamber substrate 29 on which the pressure chamber 31 is formed, an elastic film 30, a piezoelectric element 35, and a protective substrate 24, which are stacked.

The case 26 is a box-shaped member made of a synthetic resin, and the communicating substrate 23 to which the nozzle plate 22 and the pressure generation unit 14 are bonded is fixed to the lower surface side of the case 26. At the center of the case 26 in a planar view, a hollow through portion 44 having a rectangular-shaped opening which is elongated along the nozzle array direction is formed in a state of passing through the case 26 in the vertical direction.

The hollow through portion 44 communicates with a wiring hollow portion 38 of the pressure generation unit 14 so as to form a hollow portion in which an end portion of a wiring member (a flexible cable 49) and a driving IC50 are accommodated. In addition, on the lower surface side of the case 26, an accommodating hollow portion 47 having a hollow rectangular shape is formed from the lower surface to the middle portion of the case 26 in the vertical direction. The flow passage unit 21 is positioned and bonded to the lower surface of the case 26, and then the pressure generation unit which is stacked on the communicating substrate 23 is accommodated in the accommodating hollow portion 47. In addition, a lower end of the hollow through portion 44 is opened to a ceiling surface of the accommodating hollow portion 47.

An ink introduction hollow portion 46 and an ink introduction passage 45 are formed in the case 26. The ink introduction passage 45 is a narrow flow passage having a small cross-section as compared with the ink introduction hollow portion 46, and supplies ink to the ink introduction hollow portion 46 from the ink cartridge 3. The ink supplied into the ink introduction hollow portion 46 is introduced to a common liquid chamber 32 (described below) on the communicating substrate 23.

The pressure chamber substrate 29 which is a constituting member of the pressure generation unit 14 is made of a silicon substrate (one type of crystalline substrates). On the pressure chamber substrate 29, a plurality of hollow portions (hereinafter, also referred to as the pressure chamber 31) which are a plurality of the pressure chambers 31 are formed corresponding to a plurality of nozzles 27 on the nozzle plate 22 by performing anisotropic etching on the silicon substrate. As such, in a case where the pressure chamber is formed by performing the anisotropic etching on the silicon substrate, it is possible to secure higher accuracy of dimension and shape. As will be described below, two arrays of nozzles 27 are formed on the nozzle plate 22 in the embodiment, and thus the two rows of pressure chambers 31 are formed on the pressure chamber substrate 29 corresponding to each of the two arrays of nozzles. The pressure chamber 31 is a hollow portion elongated in the direction orthogonal to the nozzle array direction. The pressure chamber substrate 29 is positioned and bonded to the communicating substrate 23, and then one end portion of the pressure chamber 31 communicates with the nozzle 27 in a longitudinal direction via a nozzle communicating passage 36 (described below) of the communicating substrate 23. In addition, the other end portion of the pressure chamber 31 in the longitudinal direction communicates with the common liquid chamber 32 via an individual communicating port 43 of the communicating substrate 23.

On the surface of the pressure chamber substrate 29 (a surface on the side opposite to a surface bonded to the communicating substrate 23), an elastic film 30 is formed in a state of sealing an opening of an upper portion of the pressure chamber 31. The elastic film 30 is made of silicon dioxide having a film thickness of approximately 1 μm. In addition, an insulation film 33 is stacked on the elastic film 30. The insulation film 33 is formed zirconium oxide, for example. Further, the elastic film 30 and the insulation film function as a vibration plate 34 on which a portion corresponding to an opening surface of the pressure chamber 31 can be displaced. The piezoelectric element 35 is formed corresponding to each of the pressure chambers 31 in a state of being stacked on the vibration plate 34.

The piezoelectric element 35 of the embodiment is a piezoelectric element which is in so-called flexural mode.

Such a piezoelectric element 35 is formed in such a manner that a lower electrode 17 (corresponding to a first electrode in the invention), a piezoelectric body 18, and an upper electrode 19 (corresponding to a second electrode in the invention) are sequentially stacked on the vibration plate 34. In the embodiment, the lower electrode 17 is independently formed for each pressure chamber 31, whereas the upper electrode 19 is continuously formed over the plurality of pressure chambers 31 in the nozzle array direction. That is, the lower electrode 17 is an individual electrode which is formed for each of the pressure chambers 31, and the upper electrode 19 is a common electrode which is commonly formed over the respective pressure chambers 31. Meanwhile, it is possible to employ a reverse configuration of the aforementioned configuration depending on a state of a driving circuit or wiring. In addition, an area where the piezoelectric body 18 is interposed between a pair of the lower electrode 17 and the upper electrode 19 is an active portion in which piezoelectric strain occurs due to the voltage application on both electrodes.

In addition, various types of metal such as iridium (Ir), platinum (Pt), titanium (Ti), tungsten (W), tantalum (Ta), and molybdenum (Mo), and an alloy thereof are used as the upper electrode 19 and the lower electrode 17. An example of an alloy electrode includes $LaNiO_3$. As the piezoelectric body 18, lead zirconate titanate (PZT) which is a composite oxide containing titanium (Ti) and zirconium (Zr) is used. The piezoelectric body 18 of the embodiment is configured to have a layered structure such that a plurality of unit layers 42 are stacked in the film thickness direction, and each of the unit layers 42 is formed of a first layer 40 (corresponding to displacement layer of the invention) which has a relatively low concentration of Zr, and on which the displacement is relatively easy to occur at the time of driving the piezoelectric element 35, and a second layer 41 (corresponding to the layer having a high concentration of Zr in the invention) which has a high concentration of Zr as compared with the first layer 40 (refer to FIG. 4). In addition, when composition ratio Ti/(Zr+Ti) of Zr to Ti in each of the first layer 40 and the second layer 41 is set as Cr1 and Cr2, the composition ratio of each layer is adjusted so as to satisfy the following conditions (1) to (3).

$$0.41 \leq Cr1 \leq 0.81 \quad (1)$$

$$0.1 \leq Cr1 - Cr2 \leq 0.3 \quad (2)$$

$$Cr1 > Cr2 \quad (3)$$

That is, Cr2 can be within a range of 0.11 to 0.71.

Here, in a case where the composition ratio Cr1 of the first layer 40 is lower than 0.41, the amount of displacement of the first layer 40 becomes remarkably decreased at the time of driving the piezoelectric element 35, and thus the performance as the piezoelectric element 35 is also deteriorated. On the other hand, in a case where the composition ratio Cr1 of the first layer 40 is greater than 0.81, the amount of displacement of the first layer 40 is increased; however, a leakage current is likely to occur, and thus the reliability of the piezoelectric element 35 may become degraded. For this reason, in order to realize the practical use of the piezoelectric element 35 from the viewpoint of durability and displacement efficiency, it is desired that the composition ratio Cr1 is adjusted to be within a range of Condition (1). With this, it is possible to suppress the occurrence of the leakage current while securing the largest amount of displacement possible in the first layer 40. In addition, in a case where a difference between the composition ratio Cr1 and the composition ratio Cr2 is less than 0.1, it is difficult to suppress the leakage current which occurs in the first layer 40, in the second layer 41. On the other hand, in a case where the difference between the composition ratio Cr1 and the composition ratio Cr2 is greater than 0.3, the amount of the displacement of the second layer 41 becomes remarkably decreased at the time of driving the piezoelectric element 35, thereby resulting in that the displacement of the entire piezoelectric element 35 is inhibited. For this reason, the composition ratio Cr1 is adjusted to be within a range of Condition (2), and thereby it is possible to prevent the second layer 41 from inhibiting the displacement by efficiently suppressing the leakage current in the second layer 41.

Regarding the thickness of the piezoelectric body 18, for example, the film thickness of the first layer 40 is approximately 140 [nm], the film thickness of the second layer 41 is approximately 40 [nm], and the total thickness of the respective layers, that is, the thickness of the unit layer 42 is 180 [nm]. Such thickness of the unit layer 42 is adjusted to be within a range of 150 [nm] to 200 [nm]. A plurality of the unit layers 42 (for example, five unit layers in total) are staked on each other and then constitute the piezoelectric body 18. The thickness of the piezoelectric body 18 can be within a range of 900 [nm] to 1100 [nm].

From the lower electrode 17 of each of the piezoelectric element 35, an individual electrode wiring portion (not shown) extends into the wiring hollow portion 38, a portion corresponding to an electrode terminal of the individual electrode wiring portion is electrically connected to an individual terminal on one end side of the flexible cable 49. Similarly, from the upper electrode 19, a common electrode wiring portion (not shown) extends into the wiring hollow portion 38, and the a portion corresponding to an electrode terminal of the common electrode wiring portion is electrically connected to a common terminal on one end side of the flexible cable 49. The driving IC50 for driving the piezoelectric element 35 is mounted on the surface of the flexible cable 49.

The protective substrate 24 is disposed on the upper surface of the communicating substrate 23 on which the pressure chamber substrate 29 and the piezoelectric element 35 are stacked. The protective substrate 24 is made of, for example, glass, a ceramic material, a silicon single crystal substrate, metal, and a synthetic resin. In the inside of the protective substrate 24, a recessed portion 39 having such a size so as not to inhibit the driving of the piezoelectric element 35 is formed in an area facing the piezoelectric element 35. Further, on the protective substrate 24, the wiring hollow portion 38 passing through the substrate in the thickness direction is formed between the piezoelectric element rows which are adjacent to each other. As described above, the electrode terminal of the piezoelectric element 35 and one end portion of the flexible cable 49 are disposed in the wiring hollow portion 38.

The nozzle plate 22 is bonded to the lower surface of the communicating substrate 23. The nozzle plate 22 is a substrate on which the plurality of nozzles 27 are formed, and is bonded to the communicating substrate 23 in a state where each of the nozzles 27 communicates with each of the nozzle communicating passages 36 of the communicating substrate 23. The plurality of nozzles 27 are arranged in a row, and nozzle arrays are formed on the nozzle plate 22 at predetermined pitches. In the embodiment, two arrays of nozzles 27 are formed on the nozzle plate 22. In addition, the nozzle plate 22 is made of the silicon substrate. In addition, the nozzle 27 is formed into a cylindrical shape by performing dry etching on the plate.

Figure 5A:
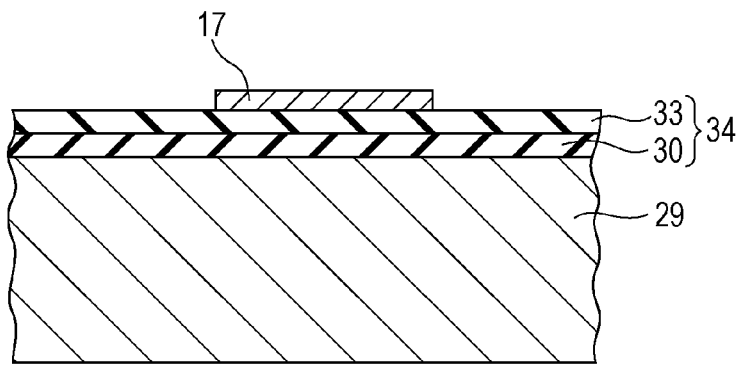
FIGS. 5A to 5D illustrate a flow diagram of steps of manufacturing the piezoelectric element.
Figure 5B:
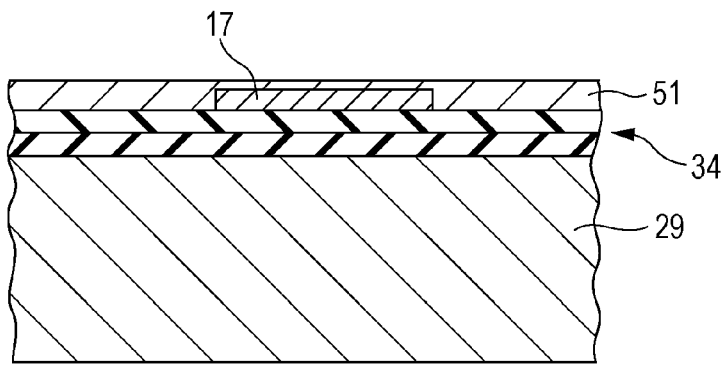
Figure 5C:
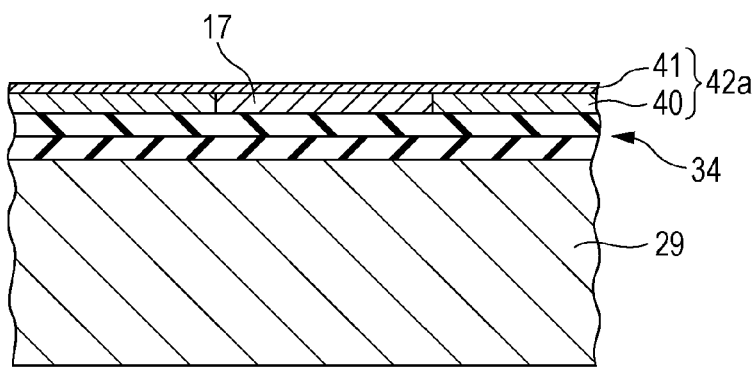

Here, a method of manufacturing the piezoelectric element 35 in the embodiment will be described with reference to FIG. 5A to FIG. 6B. First, as illustrated in FIG. 5A, a step of forming the elastic film 30 on a surface of a silicon wafer which is a material of the pressure chamber substrate 29, and a step of forming the insulation film 33, which is made of zirconium oxide on the elastic film 30 are performed. Next, a metal layer is formed on the insulation film 33, and the metal layer is patterned into a predetermined shape so as to form the lower electrode 17. Subsequently, the piezoelectric body 18 which is made of lead zirconate titanate (PZT) is formed. As the specific sequence for forming the piezoelectric body 18, first, as illustrated in FIG. 5B, the vibration plate 34 on which the lower electrode 17 is formed is coated with sol (solution) which contains Ti, Zr, and Pb such that a piezoelectric body precursor film 51, which is a first unit layer 42a, is formed. After the piezoelectric body precursor film 51 is formed, a drying step, and a degreasing step are sequentially performed. After performing the degreasing step, a baking step is performed. In the baking step, the piezoelectric body precursor film 51 is baked and then crystallized through heating for several tens of minutes by using a rapid thermal annealing (RTA) apparatus. After performing the above-described steps, as illustrated in FIG. 5C, the unit layer 42a including the first layer 40 and the second layer 41 which have different composition ratios is formed. The second layer 41 has a high concentration of Zr compared with the above-described first layer 40.

Figure 5D:
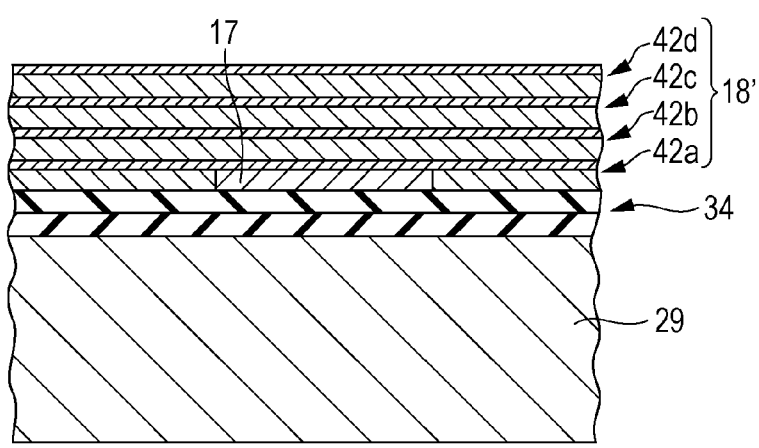
Figure 6A:
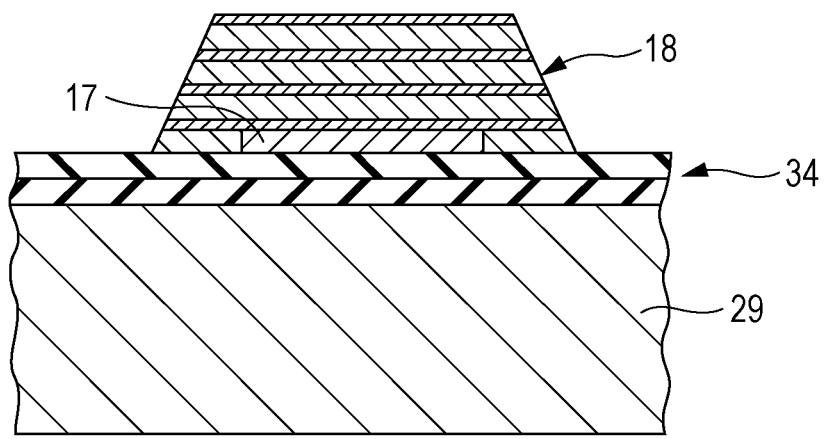
FIGS. 6A and 6B illustrate a flow diagram illustrating steps of manufacturing the piezoelectric element.
Figure 6B:
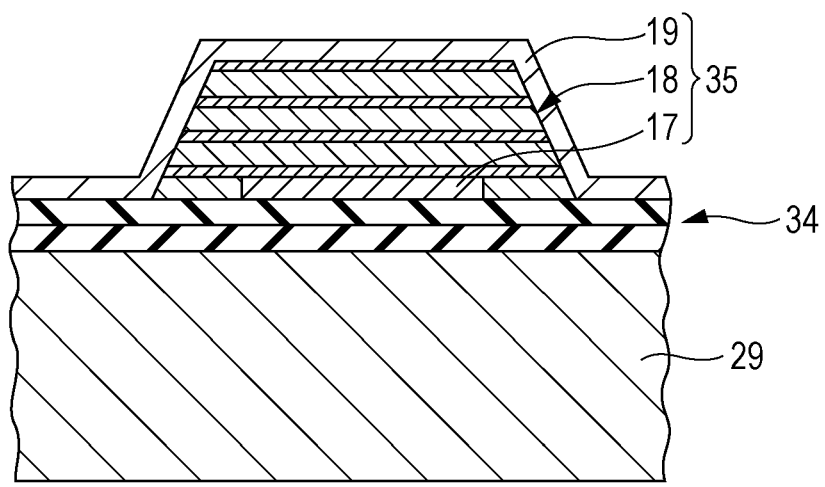

In addition, the coating step, the drying step, the degreasing step, and the baking step which are described above are performed several times, for example, repeatedly performed by four or five times so as to form a piezoelectric body layer 18' on which the plurality of the unit layers 42 (42a to 42d) are stacked as illustrated in FIG. 5D. Accordingly, the piezoelectric body layer 18' is formed in such a manner that the first layer 40 on which the displacement is relatively easy to occur, and the plurality of second layers 41 which have a high concentration of Zr as compared with the first layer 40 are stacked on each other in the film thickness direction. Note that a configuration such that the upper most layer of the piezoelectric body 18 is the second layer 41 is exemplified; however, the invention is not limited to the aforementioned configuration. For example, it is possible to employ a configuration such that the upper most layer of the piezoelectric body 18 is the first layer 40. In a case where the piezoelectric body layer 18' is formed, as illustrated in FIG. 6A, the piezoelectric body 18 is individually formed corresponding to each pressure chamber 31 by patterning the piezoelectric body layer 18' through a photolithographic method. After the piezoelectric body 18 is patterned, as illustrated in FIG. 6B, the metal layer is formed over the entire surface of vibration plate 34, on which the lower electrode 17 and the piezoelectric body 18 are formed, through a sputtering method, and then the metal layer is patterned so as to form the upper electrode 19 on the piezoelectric body 18 as the common electrode. Thereafter, a protective film (not shown) which is made of aluminum oxide ($Al_2O_3$) or the like is formed. In this way, the piezoelectric element 35 of the embodiment is formed.

As described above, the piezoelectric element 35 according to the invention is formed of the first layer 40 which has a relatively low concentration of Zr, and the second layer 41 which has a high concentration of Zr as compared with the first layer 40 are stacked on each other in the film thickness direction, that is, the plurality of second layers 41 which have a relatively high concentration of Zr are formed in the piezoelectric body 18 in the thickness direction, and thus it is possible to prevent not only the amount of displacement of the piezoelectric element 35 from being decreased, but also leakage current thereof from occurring, at the time of driving. In addition, the plurality of unit layers 42 are formed in such a way of being stacked, and thus, even in a case where one of the second layers 41 is damaged, it is possible to suppress the leakage current with other second layers 41. Therefore, the reliability of the piezoelectric element 35 is improved.

In addition, in the recording head 2 which is provided with the piezoelectric element 35 according to the invention and the printer 1 in which the recording head 2 is installed, the piezoelectric element 35 configured such that the decrease in the amount of displacement and the leakage current are prevented is installed, and thereby the improvement of the reliability can be expected.

Note that the composition ratio Cr1 of the first layer 40 is within a range of 0.41 to 0.81 in the embodiment; however, it is preferably within a range of 0.51 to 0.71. With this, it is possible to further reduce the occurrence of the leakage current in the first layer 40, and to reliably prevent the amount of the displacement from becoming decreased at the time of driving. For this reason, with the effect of preventing the leakage current in the second layer 41, it is possible to further improve the reliability of the piezoelectric element 35 without deteriorating the performance thereof.

In addition, the configuration of the recording head 2 is not limited to the foregoing description, for example, other configurations can be employed as the configuration of the recording head 2. In addition, the used of the piezoelectric element 35 is not limited to the liquid discharging head used for the liquid discharging apparatus. For example, it can be used for various sensors using a piezoelectric element. In short, it is possible to apply any piezoelectric element to the present invention as long as the piezoelectric element is made of lead zirconate titanate (PZT).

In addition, in the above-described embodiment, an ink jet recording head which is installed in an ink jet printer is exemplified as the liquid discharging head; however, the invention is applicable to other heads or apparatuses for discharging liquids other than ink. For example, a color material discharging head used for manufacturing a color filter such as a liquid crystal display, an electrode material discharging head used for forming electrodes such as an organic electro luminescence (EL) display and a field emission display (FED), a bio-organic material discharging head used for manufacturing a bio-chip (a biochemical element), and a liquid discharging apparatus which is provided with the aforementioned heads.

What is claimed is:
1. A piezoelectric element comprising:
a first electrode,
a piezoelectric body, and
a second electrode, wherein the first electrode, the piezoelectric body and the second electrode are arranged in a first direction, which is a direction extending from the first electrode to the second electrode with the piezoelectric body therebetween,
wherein the piezoelectric body contains titanium (Ti) and zirconium (Zr), and includes a plurality of unit layers,
wherein each unit layer includes a first portion and a second portion and wherein the plurality of unit layers are arranged in the first direction, and a concentration of Zr of the second portion is higher than a concentration of Zr of the first portion.

2. The piezoelectric element according to claim 1, wherein a thickness of the first portion is 140/180 of a thickness of the unit layer in the first direction, and a thickness of the second portion is 40/180 of the thickness of the unit layer in the first direction.

3. A liquid discharging head comprising:
the piezoelectric element according to claim 1, wherein a liquid in a liquid flow passage is discharged through a nozzle by driving the piezoelectric element.

4. A liquid discharging apparatus comprising the liquid discharging head according to claim 3.

5. The piezoelectric element according to claim 1, wherein a composition ratio Ti/(Zr+Ti) of the first portion is set as Cr1, and a composition ratio Ti/(Zr+Ti) of the second portion is set as Cr2,
wherein:
Cr1 is within a range of 0.41 to 0.81,
a difference between Cr1 and Cr2 is within a range of 0.1 to 0.3, and
Cr1>Cr2.

6. The piezoelectric element according to claim 5, wherein Cr1 is within a range of 0.51 to 0.71.

7. The piezoelectric element according to claim 1, wherein the piezoelectric body is formed above the first electrode by coating, drying, degreasing and baking sequentially with a solution containing Ti and Zr, wherein the coating, the drying, the degreasing and the baking are performed several times.

8. The piezoelectric element according to claim 1, wherein the first electrode is disposed in a recording head comprising a plurality of pressure chambers, the first electrode being closer to a pressure chamber of the plurality of pressure chambers than the second electrode, the first electrode is an individual electrode which is formed for each pressure chamber of the plurality of pressure chambers, and the second electrode is a common electrode which is commonly formed over the plurality of pressure chambers.

9. The piezoelectric element according to claim 1, wherein the first electrode is disposed in a recording head comprising a plurality of pressure chambers, wherein the first electrode is disposed closer to a pressure chamber of the plurality of pressure chambers than the second electrode, the first electrode is a common electrode which is commonly formed over the plurality of pressure chambers, and the second electrode is an individual electrode which is formed for each pressure chamber of the plurality of pressure chambers.

10. The piezoelectric element according to claim 1, wherein the first electrode is formed above a vibration plate, the vibration plate includes an elastic film containing silicon dioxide and an insulation film containing zirconium oxide, wherein the first electrode is formed on the insulation film.

* * * * *